(12) United States Patent
Eberler et al.

(10) Patent No.: US 7,928,731 B2
(45) Date of Patent: Apr. 19, 2011

(54) ARRANGEMENT TO ADJUST THE HOMOGENEITY OF A BASIC MAGNETIC FIELD

(75) Inventors: Michael Eberler, Postbauer-Heng (DE); Andreas Krug, Fuerth (DE); Johann Schuster, Oberasbach (DE); Stefan Stocker, Grossenassbach (DE)

(73) Assignee: Siemens Aktiengesellschaft, Munich (DE)

( * ) Notice: Subject to any disclaimer, the term of this patent is extended or adjusted under 35 U.S.C. 154(b) by 181 days.

(21) Appl. No.: 12/428,915

(22) Filed: Apr. 23, 2009

(65) Prior Publication Data

US 2009/0267607 A1  Oct. 29, 2009

(30) Foreign Application Priority Data

Apr. 24, 2008 (DE) .......................... 10 2008 020 643

(51) Int. Cl.
*G01V 3/00* (2006.01)
(52) U.S. Cl. ........................................ 324/318; 324/319
(58) Field of Classification Search .......... 324/300–322; 600/407–445
See application file for complete search history.

(56) References Cited

U.S. PATENT DOCUMENTS

| | | | | |
|---|---|---|---|---|
| 4,635,450 A * | 1/1987 | Laskaris | ........................ | 62/51.1 |
| 6,351,125 B1 * | 2/2002 | Westphal | ...................... | 324/320 |
| 6,972,652 B2 * | 12/2005 | Frantz | .......................... | 335/216 |
| 7,176,386 B1 * | 2/2007 | Aidam et al. | ................ | 174/391 |
| 7,348,773 B2 * | 3/2008 | Dewdney et al. | ............. | 324/300 |

FOREIGN PATENT DOCUMENTS

DE  10 2006 056 120  2/2008

* cited by examiner

*Primary Examiner* — Brij B Shrivastav
(74) *Attorney, Agent, or Firm* — Schiff Hardin LLP

(57) ABSTRACT

An arrangement for the adjustment of the homogeneity of a basic magnetic field in a magnetic resonance apparatus includes gradient coil support fashioned to support a gradient coil system. The gradient coil support has at least one channel that is fashioned to accommodate an associated shim tray. The shim tray is designed to accommodate ferromagnetic shim elements at predetermined positions in order to adjust the homogeneity of the basic magnetic field of the magnetic resonance apparatus. The shim tray has a first locking element coupled with it. The channel has a second locking element, and the first and second locking element are shaped such that both are positively connected with one another by a force produced by the basic magnetic field of the magnetic resonance apparatus upon activation thereof.

10 Claims, 2 Drawing Sheets

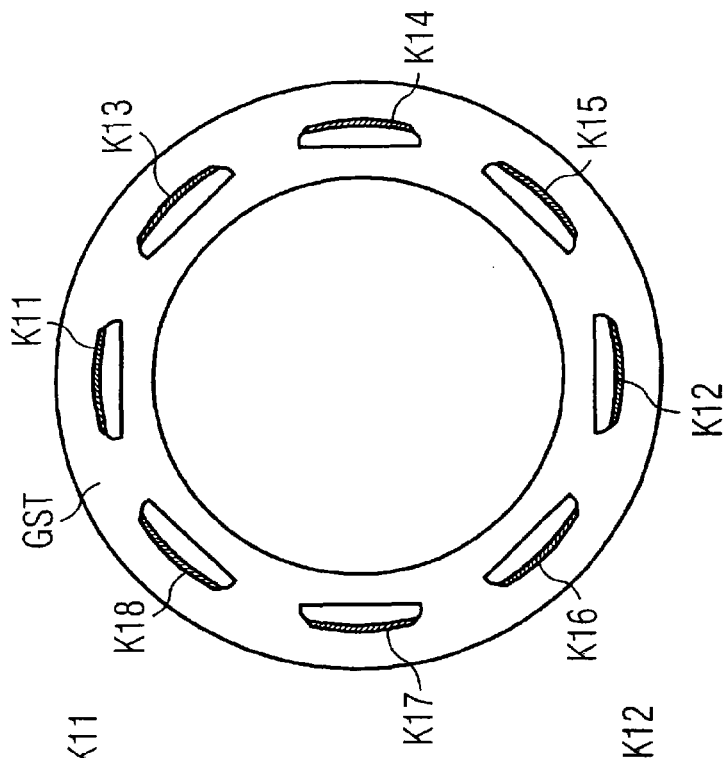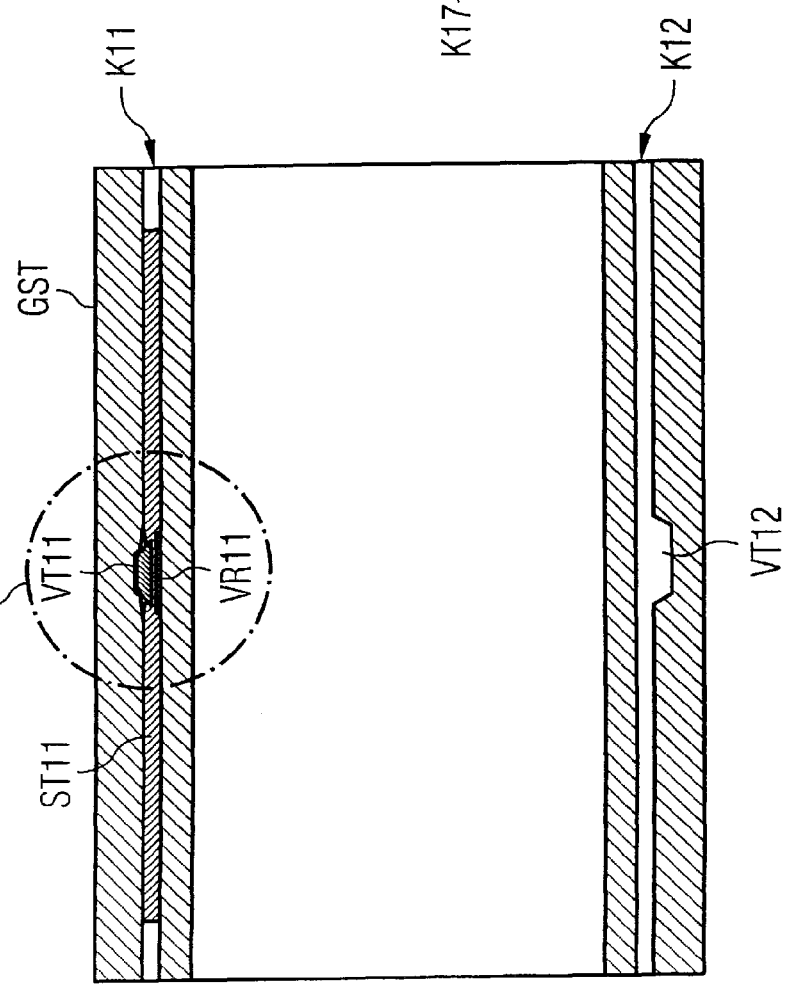

FIG 2  Single unit X
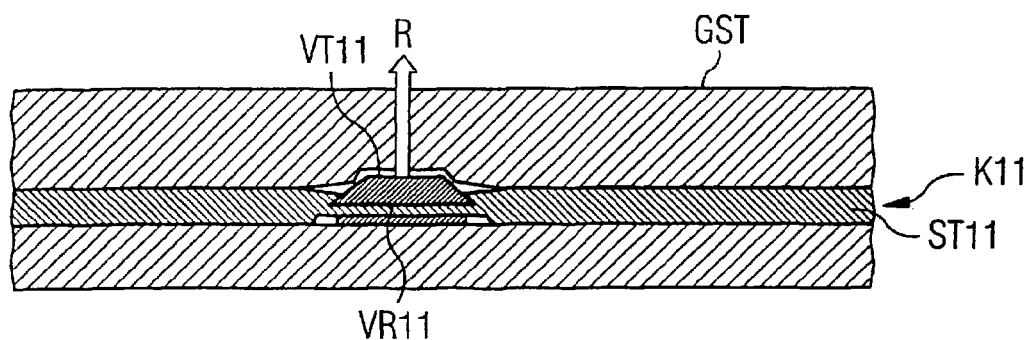
FIG 3
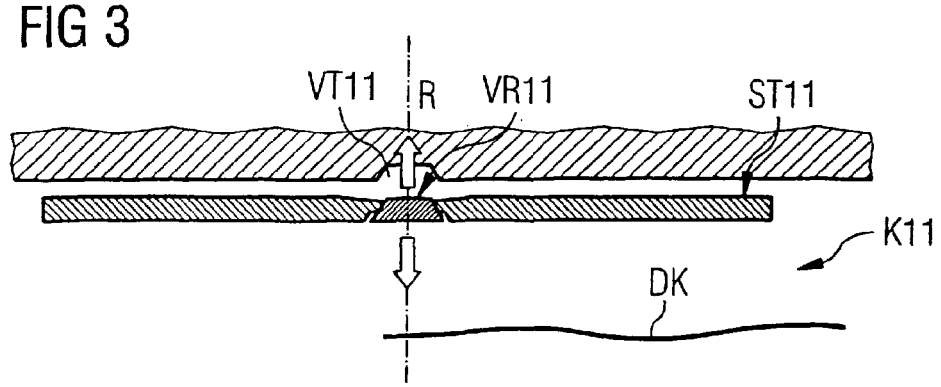

ARRANGEMENT TO ADJUST THE HOMOGENEITY OF A BASIC MAGNETIC FIELD

BACKGROUND OF THE INVENTION

1. Field of the Invention

The invention concerns an arrangement to adjust the homogeneity of a basic magnetic field in a magnetic resonance apparatus.

2. Description of the Prior Art

In a magnetic resonance apparatus it is necessary to homogenize the basic magnetic field by shimming. The shimming ensues passively, for example, with use of ferromagnetic materials.

The shimming of the basic magnetic field (also called the B0 field) is necessary due to inaccuracies in the production of the basic field magnet. Moreover, external influences at the installation site (such as iron reinforcements in the building, etc.) lead to magnetic field distortions.

In general, plates that are known as shim plates are used for shimming. These are fashioned as small iron plates or discs, for example, and are inserted into carriers formed as drawers and are positioned therein. These carrier drawers are known as shim trays.

Multiple channels that are fashioned to accommodate the shim trays (and thus serve for the arrangement or positioning of the shim plates) are fashioned at the gradient coil carrier of the magnetic resonance scanner.

In a first pass, for the adjustment of the desired homogeneity the basic magnetic field is measured without additional shim plates. If an insufficient homogeneity of the basic magnetic field exists, the positions of individual shim trays at which shim plates must be inserted in order to improve the homogeneity is then calculated.

The shim plates are inserted and fixed at these positions. The magnetic field is then reestablished and its homogeneity is measured again.

It is necessary to secure the respective shim trays or carrier drawers against movement with elaborate means. For example, this ensues using specially designed bolt connections.

This increased expenditure is necessary because magnetic forces that could loosen the bolt connection act on the shim trays. Forces of multiple hundreds of Newtons act on a single shim tray, and therefore on the associated bolt connections.

The shim trays must additionally be secured against vibrations that are caused by the gradient coil in operation.

An additional disadvantage results from the fact that the gradient coil support and the gradient coil system attached thereto are composed of different materials that exhibit different thermal properties and expand differently upon heating.

Gradient coil systems and gradient coil carriers form a module composed of epoxy resin, glass, copper, etc. These materials become heated up to 80° C. in operation and expand differently, such that the homogeneity of the magnetic field is also affected due to relative position changes of the shim elements.

SUMMARY OF THE INVENTION

An object of the present invention is to provide an arrangement that enables a definitive adjustment of the homogeneity of the basic magnetic field in a magnetic resonance apparatus with little effort.

The arrangement according to the invention for the adjustment of the homogeneity of a B0 magnetic field in a magnetic resonance apparatus has a gradient coil support (carrier) that is fashioned to support a gradient coil system.

The gradient coil support has at least one channel that is fashioned to accommodate an associated carrier drawer. The carrier drawer is designed to accommodate ferromagnetic shim elements at predetermined positions in order to adjust the homogeneity of the B0 magnetic field.

According to the invention, the carrier drawer has a first locking element coupled with it. The accepting channel for the shim elements has a second locking element. The first and second locking elements are formed and arranged such that both are positively connected with one another (forced together) by the basic magnetic field of the magnetic resonance apparatus upon activation thereof.

The arrangement according to the invention enables a passive shimming that requires no bolt connections and that therefore is very secure and constant.

Due to the preferred central positioning of the locking elements in the channel or at the carrier drawer, a shimming effect is produced even given different thermal expansions of elements of the gradient coil module. The homogeneity of the B0 magnetic field is therefore additionally, advantageously stabilized.

Since the activation of the basic magnetic field generally ensues during an initial start-up, the shimming by means of the arrangement according to the invention is assured and stable in the long term. It is thereby achieved that the carrier drawers remain locked tight during the entire lifespan of the magnetic resonance apparatus.

The first locking element can be ferromagnetic, so it is pulled radially outwardly relative to the longitudinal axis of the gradient coil system upon activation of the basic magnetic field and is pulled into the associated second locking element.

BRIEF DESCRIPTION OF THE DRAWINGS

FIG. 1A is a side view and FIG. 1B is a front view of the arrangement according to the invention.

FIG. 2 shows, with reference to FIGS. 1A and 1B, the arrangement according to the invention in an enlarged presentation.

FIG. 3 shows, with reference to FIGS. 1A and 1B and FIG. 2, a schematically illustrated installation.

DESCRIPTION OF THE PREFERRED EMBODIMENTS

FIG. 1A shows the arrangement according to the invention in a side view as a section presentation and FIG. 1B shows the arrangement in a front view.

In a magnetic resonance apparatus, a gradient coil support GST is provided that here is designed as a cylindrical GRP support, for example.

The gradient coil support GST carrier (supports) three coils of a gradient coil system, namely an X-gradient coil, a Y-gradient coil and a Z-gradient coil (not shown in detail).

Here eight channels K11 through K18 are provided on the gradient coil support GST, for example, which channels K11 through K18 are fashioned to accept carrier drawers ST1$x$ known as shim trays. The channels K11 through K18 are preferably of similar design.

Ferromagnetic shim elements (not shown in detail) known as shim plates that are arranged at predetermined positions of each shim tray ST1$x$, are used to shim the homogeneity of a magnetic field. The adjustment of the homogeneity of the magnetic field of the magnetic resonance apparatus ensues with the use of the position of the shim elements as well as the dimensions of the shim elements.

In the side view a first channel K11 and a second channel K12 are visible. The first channel K11 contains a first shim tray ST11 while the second channel K12 is empty (i.e. unpopulated).

The first shim tray ST11 is preferably centrally arranged in the first channel K11 relative to the length of the first channel K11. The first shim tray ST11 has a locking element VR11 that is tightly coupled or connected with it.

This locking element VR11 is preferably centrally arranged relative to the length of the first shim tray ST11.

The first channel K11 preferably possesses a depression [recess] VT11 in its center relative to the length of the first channel K11.

This depression CT11 serves for the positive accommodation of the locking element VR11, which is an integrated component of the first shim tray ST11.

The first locking element VR11 of the first shim tray ST11 thereby interacts with the depression VT11 of the first channel K11 such that, given an activated basic magnetic field, the locking element VR11 is firmly and immovably pressed into the depression VT11. The first shim tray ST11 is therefore locked in the first channel K11 given an activated B0 magnetic field.

Due to the active magnetic field, the first locking element VR11 is thus pulled (forced) outwardly relative to the longitudinal axis of the gradient coil support GST, so it is pressed into the first depression VT11 and thereby locked against it.

The locking element VR11 is therefore either manufactured entirely from a ferromagnetic material or contains a ferromagnetic material.

The second channel also preferably has a depression VT12 in the center relative to its length. This depression VT12 serves for the positive accommodation of a locking element (not shown in detail here) that is a component of a shim tray that is provided for the second channel K12.

The interaction of the depression VTx on the one side and the associated locking element VRx on the other hand is explained in detail in FIG. 2.

The depression in the channel (that has been described previously as an example) and the locking element projecting from the shim tray can be replaced by latching devices of any other design while maintaining the described principle of locking effected by the activated basic magnetic field.

FIG. 2 shows the arrangement according to the invention in an enlarged presentation, with reference to FIGS. 1A and 1B.

The locking element VR11 here is shaped conically or as a frustum of a cone. The depression VT11 designed to accommodate the locking element VR11 is correspondingly fashioned as the inverse in a funnel or lens shape.

In a first embodiment, the locking element VR11 is executed as a fixed component of the shim tray ST11.

As an alternative, in a second embodiment the locking element VR11 is fashioned as a separate module and is merely coupled with the shim tray ST11 so that its position on the shim tray can be predetermined.

Given an activated basic magnetic field, the locking element VR11 is pressed into the depression VT11 in the direction of the arrow R so that the shim tray ST11 is fixed within the channel K11.

FIG. 3 shows a principle depiction of the installation of the shim tray ST11 with reference to FIGS. 1A and 1B and FIG. 2.

Here the shim tray ST11 is inserted into the channel K11 together with a pressure pad DK. Using compressed air, the pressure pad DK is inflated in order to bring the locking element VR11 into position relative to the associated depression VT11.

The pressure pad DK can thereby act both directly on the locking element VR11 and indirectly via the shim tray ST11.

Via the compressed air, the shim tray ST11 is pre-positioned in the channel K11 until the basic magnetic field acts and produces the final locking.

Although modifications and changes may be suggested by those skilled in the art, it is the intention of the inventors to embody within the patent warranted hereon all changes and modifications as reasonably and properly come within the scope of their contribution to the art.

We claim as our invention:

1. An arrangement for adjusting the homogeneity of a basic magnetic field in a magnetic resonance apparatus having a basic field magnet that generates a basic magnetic field having said homogeneity, said arrangement comprising:
    a shim tray containing a plurality of ferromagnetic shim elements at predetermined positions in said shim tray;
    a gradient coil support configured to support a gradient coil system of the magnetic resonance apparatus;
    said gradient coil support having at least one channel therein configured to receive said shim tray therein, with the respective positions of the ferromagnetic shim elements in said shim tray, when said shim tray is in said channel, adjusting the homogeneity of the basic magnetic field;
    said shim tray comprising a first locking element coupled to said shim tray and said channel comprising a second locking element that mates with said first locking element; and
    said first and second locking element being forced together into mechanical connection with each other by said basic magnetic field upon activation of said basic magnetic field.

2. An arrangement as claimed in claim 1 wherein said first locking element is a projection of said shim tray, and said second locking element is a depression in said channel, conforming in shape to said projection.

3. An arrangement as claimed in claim 1 wherein said first locking element has a conical shape selected from the group consisting of a cone shape and a cone frustum shape, and wherein said second locking element has a shape selected from the group consisting of a funnel-shape and a lens-shape.

4. An arrangement as claimed in claim 1 wherein said first locking element is at least partially comprised of ferromagnetic material.

5. An arrangement as claimed in claim 4 wherein said first locking element is configured to be drawn outwardly relative to a longitudinal axis of said gradient coil support, upon activation of said basic magnetic field, to press said first locking element into the second locking element.

6. An arrangement as claimed in claim 1 wherein said first locking element is an integrated, fixed component of said shim tray.

7. An arrangement as claimed in claim 1 wherein said first locking element is a component separate from, and connected to, said shim tray via an element coupling.

8. An arrangement as claimed in claim 1 wherein said shim tray is located centrally in said channel, relative to a length of said channel.

9. An arrangement as claimed in claim 1 wherein said second locking element is located centrally relative to a length of said channel.

10. An arrangement as claimed in claim 9 wherein said first locking element is located centrally relative to the length of the shim tray.

* * * * *